United States Patent
Humm et al.

(10) Patent No.: US 10,647,495 B2
(45) Date of Patent: May 12, 2020

(54) DEHUMIDIFYING APPARATUS FOR A HOUSING

(71) Applicant: ebm-papst Mulfingen GmbH & Co. KG, Mulfingen (DE)

(72) Inventors: Markus Humm, Weissbach (DE); Ralph Wystup, Kuenzelsau (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 628 days.

(21) Appl. No.: 15/375,242

(22) Filed: Dec. 12, 2016

(65) Prior Publication Data

US 2017/0225866 A1    Aug. 10, 2017

(30) Foreign Application Priority Data

Feb. 4, 2016 (DE) .......... 10 2016 101 962

(51) Int. Cl.
| | |
|---|---|
| H05K 5/06 | (2006.01) |
| B01D 53/26 | (2006.01) |
| B65D 81/26 | (2006.01) |
| H05K 5/02 | (2006.01) |
| H02K 11/30 | (2016.01) |
| H02K 5/04 | (2006.01) |
| H02K 9/00 | (2006.01) |

(52) U.S. Cl.
CPC ......... *B65D 81/266* (2013.01); *B01D 53/261* (2013.01); *B01D 53/268* (2013.01); *H02K 5/04* (2013.01); *H02K 9/00* (2013.01); *H02K 11/30* (2016.01); *H05K 5/0213* (2013.01)

(58) Field of Classification Search
CPC .. B01D 53/261; B01D 53/268; B65D 81/266; H02K 11/30; H02K 5/04; H02K 9/00; H05K 5/0213
USPC ................ 96/4, 7, 118, 134, 143, 146–148; 55/385.4; 95/52
See application file for complete search history.

(56) References Cited

U.S. PATENT DOCUMENTS 2,396,474 A * 3/1946 Riley .................. F24F 3/1411
 210/DIG. 6
3,315,447 A * 4/1967 Meier .................. F24F 3/1411
 55/492

(Continued)

FOREIGN PATENT DOCUMENTS

WO  WO-2013/079102 A1  6/2013

*Primary Examiner* — Frank M Lawrence, Jr.
(74) *Attorney, Agent, or Firm* — Harness, Dickey & Pierce, P.L.C.

(57) ABSTRACT

A dehumidifying device for a housing, in particular an electronics housing of an electromotor with a dehumidifying chamber includes a wall inside of which a hygroscopic material is received which is designed to bind air moisture from the dehumidifying chamber. The wall of the dehumidifying chamber includes at least one inner membrane permeable to vapor which can be brought into an active connection with an inner receiving space of the housing and an outer membrane which can be brought into an active connection with the outside environment of the housing. The at least one inner membrane and the outer membrane are permeable to vapor at least in a direction in which a transport of air moisture out of the inner receiving space of the housing through the dehumidifying chamber into an outside environment can be ensured.

16 Claims, 2 Drawing Sheets

(56) References Cited

U.S. PATENT DOCUMENTS

| | | | | |
|---|---|---|---|---|
| 4,796,163 | A * | 1/1989 | Dressler | F21S 45/33 |
| | | | | 362/547 |
| 6,422,729 | B1 * | 7/2002 | Rohrbach | F21S 48/335 |
| | | | | 362/539 |
| 7,549,272 | B2 * | 6/2009 | DeFedericis | B01D 53/0407 |
| | | | | 156/267 |
| 2013/0044393 | A1 * | 2/2013 | Brown | H05K 5/0213 |
| | | | | 360/97.16 |
| 2013/0067661 | A1 * | 3/2013 | Schwirian | A61G 7/05 |
| | | | | 5/600 |

* cited by examiner

DEHUMIDIFYING APPARATUS FOR A HOUSING

FIELD

The invention relates to a dehumidifying device for a housing, in particular an electronics housing of an electromotor and to the electronics housing and the electromotor with such a dehumidifying device.

BACKGROUND

Moisture is harmful for electronic structural groups. Therefore, efforts are frequently made in housings and electronics housings to prevent a direct entrance of water and also to prevent a formation of condensation water by sealing measures. Complete seals are technically possible; however, it is not excluded that in the case of temperature fluctuations and the associated, repeated expansion and contraction undesired fissures are produced through which moisture can penetrate and damage the electronics. Flexible sealing systems are also known; however, they are comparatively complex and expensive.

The disclosure of WO 2013/079102 A1 can be cited as an example of known prior art.

SUMMARY

The disclosure therefore has the basic problem of making available a dehumidifying device for housings, especially electronics housings of electromotors which can be economically realized and has a long service life.

According to the disclosure, a dehumidifying device for a housing, in particular an electronics housing of an electromotor is suggested with a dehumidifying chamber comprising a wall inside which chamber hygroscopic material is received. The hygroscopic material is designed to bind air moisture from the dehumidifying chamber. The wall of the dehumidifying chamber comprises at least one inner membrane permeable to vapor which can be brought into an active connection with an inner receiving space of the housing, and comprises an outer membrane which can be brought into an active connection with the outside environment of the housing. The inner and the outer membranes are permeable to vapor at least in the direction in which a transport of air moisture out of the inner receiving space of the housing through the dehumidifying chamber into the outside environment can be ensured.

An expensive sealing of the housing is not necessary when using the dehumidifying device but rather it becomes possible that the moisture from the inner receiving space of the housing is diffused through the inner membrane into the dehumidifying chamber and is bound there by the hygroscopic material. Due to the saturation equilibrium which is naturally always striven for, moisture in the form of vapor diffuses into the dehumidifying chamber until an equilibrium of vapor pressure prevails. At the same time an emission of moisture into the outside environment is made possible via the outer membrane so that the capacity of the hygroscopic material to receive water is always ensured. The dehumidifying system according to the disclosure functions with membranes which are bidirectionally permeable as long as the air moisture in the outside environment is less than in the dehumidifying space.

An advantageous embodiment provides that at least the outer membrane is impermeable to water. This ensures that no excessive amount of moisture from the outside environment can penetrate into the dehumidifying chamber, as a result of which the hygroscopic material could become saturated with water. To this end the inner and the outer membranes can be constructed to be semipermeable.

In a further development of the dehumidifying device the inner membrane is unidirectionally permeable to vapor into the dehumidifying chamber, i.e., from the inner receiving space into the dehumidifying chamber. In addition, the outer membrane is unidirectionally permeable to vapor from the dehumidifying chamber, i.e., from the dehumidifying chamber to the outside environment. A penetration of moisture from the outside environment into the dehumidifying chamber is therefore excluded, even if the absolute air moisture in the outside environment is at times greater than in the dehumidifying chamber.

Furthermore, an embodiment of the disclosure provides that the inner membrane has a lesser permeability to moisture than the outer membrane. As a result of the higher permeability to moisture of the outer membrane bordering on the outside environment, the permeability to vapor to the outside tends to be increased, so that given a high saturation with water of the hygroscopic material a drying and evaporation into the outside environment is favored.

In an exemplary embodiment of the disclosure, the wall of the dehumidifying chamber is formed by the inner and the outer membranes. The inner and the outer membranes surround the hygroscopic material here and completely form by themselves the transitions between the inner receiving space and the outside environment. The two membranes can be, for example, sewed, adhered or otherwise be fastened to one another to this end on their edge sections, wherein it is always provided that the inner membrane faces the inner receiving space and the outer membrane faces the outside environment.

The hygroscopic material is selected from materials with a high water absorption capacity, in particular calcium chloride ($CaCl_2$), silica gel ($SiO_2$), calcium carbonate ($K_2CO_3$) or zeolite.

The inner and the outer membranes are formed in an embodiment from a high-polymeric membrane or a parchment membrane. Embodiments are also included in which the inner and the outer membranes are made from formed fabric, in particular polyethylene formed fabric or extruded polytetrafluoroethylene (PTFE) or polyether sulfone (PESU). The pore size of the membranes is preferably up to 40 nanometers. Additional coatings can also be provided on the membranes which coatings favor a unidirectional permeability for vapor.

A further development provides that the dehumidifying chamber can be heated. For this, a heating wire is arranged at least in sections around the dehumidifying chamber in an exemplary embodiment by means of which the dehumidifying chamber and the hygroscopic material located in it can be heated. As a result of the heating and of the therefore elevated temperature the moisture bound as water can be separated from the hydroscopic material and removed to the outside environment via the outer membrane by the partial pressure increased by the vapor being produced. In order to securely avoid that the vapor does not diffuse via the inner membrane when a heated dehumidifying chamber is provided according to the disclosure, a unidirectional inner membrane exclusively with a direction of vapor flow into the dehumidifying chamber is preferred. Alternatively, inner and outer membranes with different permeabilities can be used in which the outer membrane has a lesser resistance and in this manner the concentration and pressure gradient is compensated by the latter.

In an embodiment the heating wire is designed as a hot wire. The hot wire is characterized in that it has a temperature-dependent change of the wire resistance which can be measured for its part. As a result of the measuring of the wire resistance, a regulation of the temperature and of the desired heat conduction can be readily achieved.

Furthermore, an exemplary embodiment provides that a moisture measuring sensor is arranged in the dehumidifying chamber. Alternatively or additionally, a moisture measuring device which measures the moisture saturation of the hygroscopic material is provided in the dehumidifying chamber. The moisture measuring device is realized in an embodiment, for example, by an electrical conductivity meter whose signals can be detected by a control device. Therefore, a switch can be realized in which a controlling of the heating of the dehumidifying him chamber and of the hydroscopic material takes place as a function of a measured value of the absolute moisture in the dehumidifying chamber and/or of the saturation of the hygroscopic material. As soon as a limit value of the water absorption has been reached, the heating is used for the drying.

In an advantageous embodiment the dehumidifying chamber is constructed as a replaceable and/or retrofittable modular unit. It can therefore be used in existing housings or, if required, simply replaced. It is also made possible that the dehumidifying performance of the individual dehumidifying chambers can be adjusted to greatly different strengths and that the dehumidifying chambers to be used are adapted to the particular purpose of use. In this manner standard housings for all uses can be produced which can be equipped with different dehumidifying devices.

The disclosure furthermore comprises housings, in particular an electronics housing of an electromotor, with a housing wall which surrounds at least in sections an inner receiving space of the housing, wherein the inner receiving space is constructed to receive motor electronics. The housing is characterized in that it has no seal against the environment and comprises a previously described dehumidifying device.

In addition, the disclosure comprises an electromotor with motor electronics in an electronic housing, wherein the motor electronics comprises a performance module which is arranged adjacent to the dehumidifying device so that during the operation of the electromotor heat generated by the performance module can be transferred to the dehumidifying device in order to heat the dehumidifying chamber. The heating of the dehumidifying chamber can therefore take place without additional structural components and is realized by the performance module which is already being used in any case and is generating sufficient heat. If the temperature of the performance module required for this should not be achieved for a rather long time, the performance module is controlled in such a manner in an embodiment that it does become heated but does not significantly change the function of the device. In addition, the module temperature of the performance module is detected by a temperature sensor built into the performance module.

The previously described features can be combined in any manner to the extent that they do not conflict and that this is technically possible.

DRAWINGS

Other advantageous further developments of the disclosure are shown in detail in the following together with the description of the preferred embodiment of the invention using the figures. The figures schematically show by way of example:

DESCRIPTION

Figure 1:
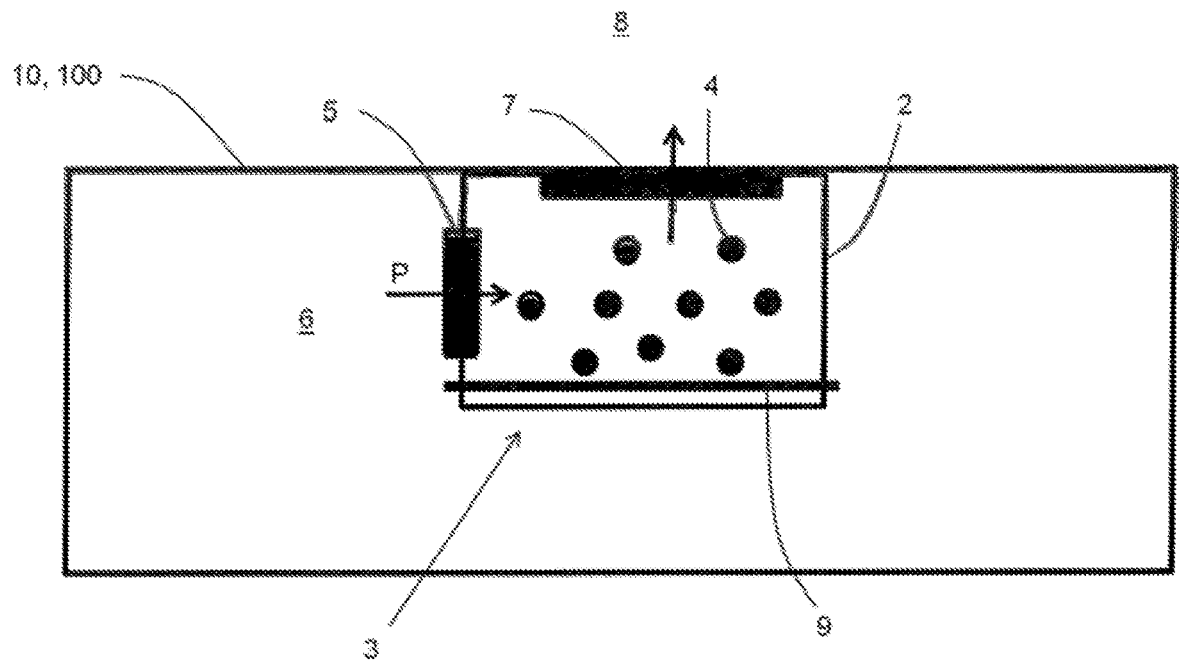
FIG. 1 shows a dehumidifying device mounted in a housing.

FIG. 1 shows a schematic view of a dehumidifying device 1 mounted in the housing 10 which can also serve as an electronics housing 100 of an electromotor. The dehumidifying device 1 comprises a dehumidifying chamber 3 in which hygroscopic material 4 is received in different locations. In order to enlarge the total surface and therefore to raise the rate of the binding of water, the hygroscopic material 4 is distributed at several locations inside the dehumidifying chamber 3. The inner, vapor-permeable membrane 5 is provided on the wall 2 of the dehumidifying chamber 3 adjacent to the inner receiving space 6 of the housing 10 and the outer, vapor-permeable membrane 7 is provided adjacent to the outside environment 8 of the housing 10. The inner and the outer membranes 5, 7 each form a partial surface of the wall 2 of the dehumidifying chamber 3. In the embodiment shown the inner and the outer membranes 5, 7 are permeable to vapor in the direction of arrow P and make possible a transport of air moisture from the inner receiving space 6 of the housing 10 through the dehumidifying chamber 3 into the outside environment 8. The vapor pressure gradient between the inner receiving space 6 of the housing 10 and the interior of the dehumidifying chamber 3 is produced by the hygroscopic material 4. In the case of elevated moisture in the housing interior, for example, by condensation, the absolute air moisture inside the dehumidifying chamber 3 on account of the hygroscopic material 4 is lower than inside the housing 10, so that an equilibrium of saturation and of pressure takes place via the inner membrane 5. The air moisture is bound by the hydroscopic material 4 as water. In the case of strong dehumidification, the absolute moisture inside the dehumidifying chamber 3 can become greater than in the area of the outside environment 8. Then, moisture from the dehumidifying chamber 3 is given off via the outer membrane 7 to the outside environment 8. The inner and the outer membrane 5, 7 are unidirectionally permeable and impermeable to water in the direction of arrow P.

A heating wire 9 constructed as a hot wire is arranged around the dehumidifying chamber 3 as an embodiment for the regeneration of the hygroscopic material 4. The dehumidifying chamber 3 and the hygroscopic material 4 located in it can be greatly heated by the heating 9 so that the bound water evaporates and the hygroscopic material 4 again has its complete or substantially complete coefficient of water absorption w of the particular hygroscopic material.

The following applies here:

$$w = \frac{m}{A x \sqrt{t}}$$

in which m and A stand for mass and base surface of the hygroscopic material and t stands for the time. Materials classified as "absorbent" and with a value of the coefficient of water absorption $w > 2 \text{ kg/m}^2\text{h}^{0.5}$, for example, calcium chloride are used for the invention. The inner and the outer membranes 5, 7 consist of extruded PTFE and are clamped into the wall 2 of the housing 10, 100 as a flat wall part.

Figure 2:
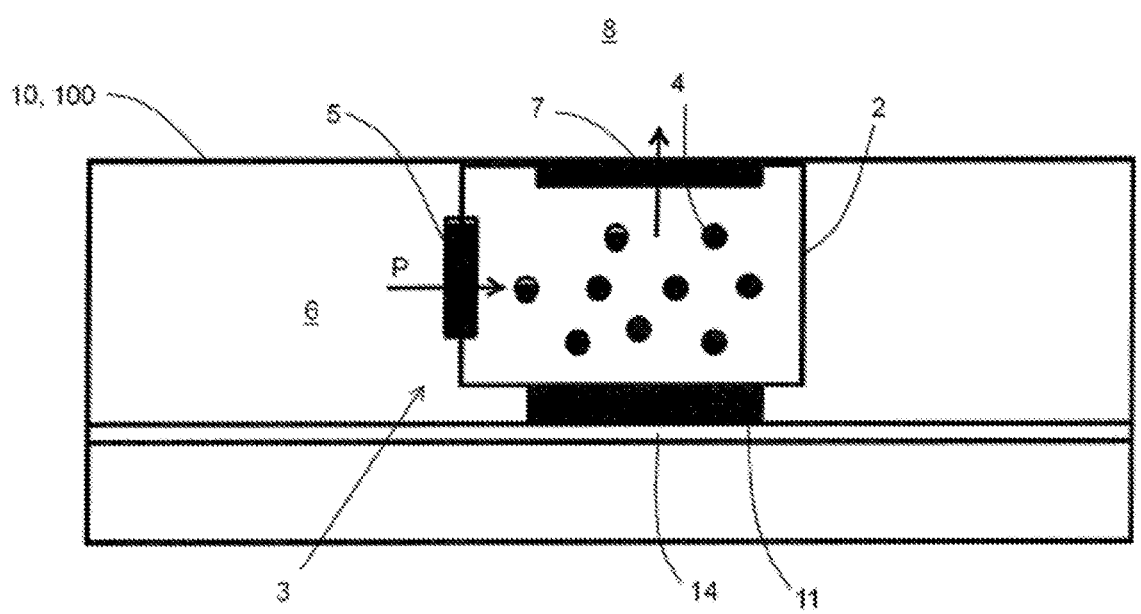
FIG. 2 shows a dehumidifying device mounted on a performance module in a housing.

FIG. 2 comprises a dehumidifying chamber 3 with the features from FIG. 1 so that repetitions in this regard are avoided. However, the dehumidifying chamber 3 is arranged on a performance module 11 of a motor electronics which module is located on a printed circuit board 14. The printed circuit board 14 as well as the performance module 11 are located inside the receiving space 6 of the housing 10 or of electronics housing 100. The performance module 11 can be selectively controlled so that it can also only produce heat without influencing the operation of the device and/or of the motor. As an alternative embodiment of the heating wire, the dehumidifying chamber 3 can be heated and the hygroscopic material 4 dried by the production of heat. The transport of moisture also takes place in this embodiment according to the direction of arrow P from the inner receiving space 6 to the outside environment 8.

Figure 3:
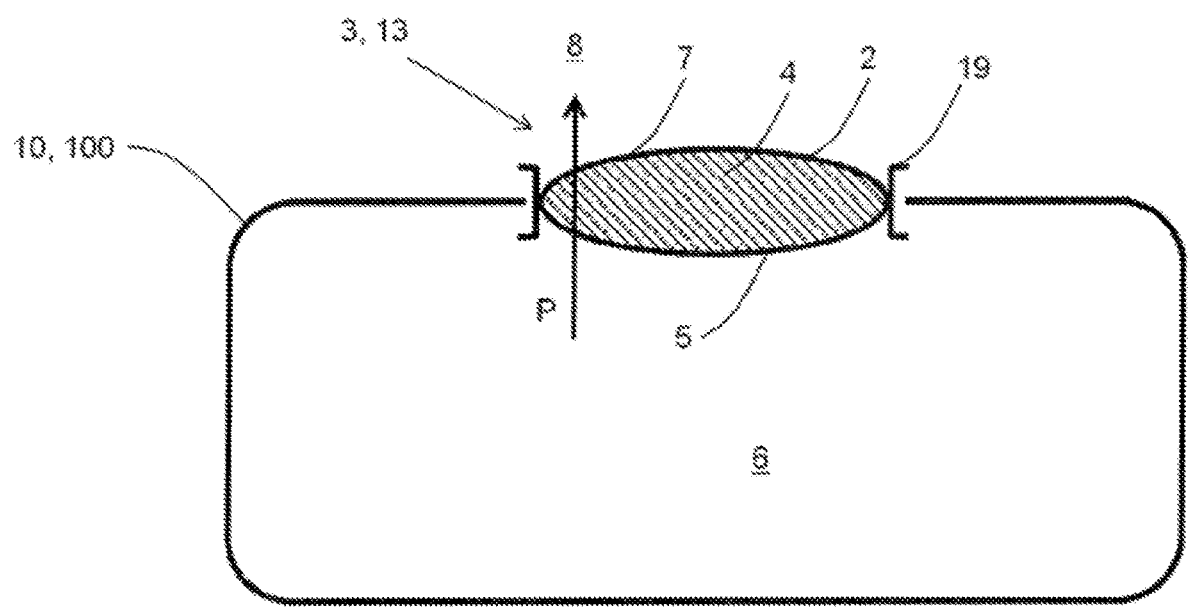
FIG. 3 shows a dehumidifying device as a module unit mounted in a housing wall.

FIG. 3 schematically shows by way of example a dehumidifying chamber 3 constructed as a replaceable, retrofittable modular unit 13. The entire wall of the dehumidifying chamber 3 is formed by the inner and outer membranes 5, 7 themselves. The hygroscopic material 4 is received between the inner and the outer membranes 5, 7. The dehumidifying chamber 3 constructed as modular unit 13 is fastened by appropriate receptacles 19 in the housing wall and separates the receiving space 6 to be dehumidified from the outside environment 8 so that the transport of moisture also takes place in this embodiment according to the direction of arrow P. Even if the figure shows the hygroscopic material 4 as completely filling the dehumidifying chamber 13, embodiments are also comprised in which the hygroscopic material 4 is provided only partially and/or distributed so that a current of air through the dehumidifying chamber 3 can be ensured.

The disclosure is not limited in its execution to the preferred exemplary embodiments indicated above. For example, materials known in the market such as Tyvek (registered trademark), especially type 16, which meet the technical prerequisites of vapor permeability of the disclosure can be used as membrane. In addition, the hygroscopic material in the dehumidifying chamber can also be wrapped up with such material. Other alternatives for the membrane material are, for example, parchment or clay cells with inclusions of, e.g., copper hexacyanoferrate (II) or cellulose acetate.

The invention claimed is:

1. A dehumidifying device for an electronics housing comprising:
    an electronics housing;
    an inner receiving space of the housing,
    a wall of the housing defines a dehumidifying chamber fully within the inner receiving space of the housing, the dehumidifying chamber receiving a hygroscopic material, the hygroscopic material is designed to bind air moisture from the dehumidifying chamber, the wall of the housing defining the dehumidifying chamber comprises at least one inner membrane permeable to vapor that can be brought into an active connection with the inner receiving space of the housing; and
    an outer membrane that can be brought into an active connection with the outside environment of the electronics housing, the inner and the outer membranes are permeable to vapor at least in a direction where a transport of air moisture, can be ensured, out of the inner receiving space of the electronics housing through the dehumidifying chamber into an outside environment.

2. The dehumidifying device according to claim 1, wherein at least the outer membrane is impermeable to water.

3. The dehumidifying device according to claim 1, wherein the inner membrane is unidirectionally permeable to vapor into the dehumidifying chamber and the outer membrane is unidirectionally permeable to vapor from the dehumidifying chamber.

4. The dehumidifying device according to claim 1, wherein the at least one inner membrane and the outer membrane can be constructed to be semipermeable.

5. The dehumidifying device according to claim 1, wherein the at least one inner membrane has a lesser permeability to moisture than the outer membrane.

6. The dehumidifying device according to claim 1, wherein the wall of the dehumidifying chamber is formed by the at least one inner membrane and the outer membrane.

7. The dehumidifying device according to claim 1, wherein the hygroscopic material is selected from one of calcium chloride ($CaCl_2$)), silica gel ($SiO_2$), calcium carbonate ($K_2CO_3$) or zeolite.

8. The dehumidifying device according to claim 1, wherein the at least one inner membrane and the outer membrane are formed from a high-polymeric membrane or a parchment membrane.

9. The dehumidifying device according to claim 1, wherein the at least one inner membrane and the outer membrane are made from a formed fabric, in particular a polyethylene formed fabric, an extruded polytetrafluoroethylene (PTFE) or a polyether sulfone (PESU).

10. The dehumidifying device according to claim 1, wherein the dehumidifying chamber can be heated.

11. The dehumidifying device according to claim 1, wherein a heating wire is arranged at least in sections around the dehumidifying chamber with which the dehumidifying chamber and the hygroscopic material can be heated.

12. The dehumidifying device according to claim 1, wherein a moisture measuring sensor is provided in the dehumidifying chamber.

13. The dehumidifying device according to claim 1, wherein a moisture measuring device which measures the moisture saturation of the hygroscopic material is provided in the dehumidifying chamber.

14. The dehumidifying device according to claim 1, wherein the dehumidifying chamber is constructed as a replaceable and/or retrofittable modular unit.

15. A housing, in particular an electronics housing of an electromotor, the housing comprising:
    a housing wall which surrounds at least in sections an inner receiving space of the housing; wherein
    the inner receiving space is constructed to receive motor electronics;
    the housing has no seal against the outside environment; and
    the housing includes a dehumidifying device further comprising:
    the wall of the housing defines a dehumidifying chamber fully within the inner receiving space of the housing, the dehumidifying chamber receiving a hygroscopic material, the hygroscopic material is designed to bind air moisture from the dehumidifying chamber, the wall of the housing defining the dehumidifying chamber comprises at least one inner membrane permeable to vapor that can be brought into an active connection with the inner receiving space of the housing; and an outer membrane that can be brought into an active connection with the outside environment of the electronics housing, the inner and the outer membranes are permeable to vapor at least in a direction where a transport of air moisture, can be ensured, out of the inner receiving space of the electronics housing through the dehumidifying chamber into an outside environment.

16. An electromotor with motor electronics in an electronic housing according to claim 1, wherein the motor electronics comprise a performance module which is arranged adjacent to the dehumidifying device so that during the operation of the electromotor heat generated by the performance module can be transferred to the dehumidifying device in order to heat the dehumidifying chamber.

* * * * *

UNITED STATES PATENT AND TRADEMARK OFFICE
CERTIFICATE OF CORRECTION

PATENT NO. : 10,647,495 B2
APPLICATION NO. : 15/375242
DATED : May 12, 2020
INVENTOR(S) : Markus Humm et al.

It is certified that error appears in the above-identified patent and that said Letters Patent is hereby corrected as shown below:

In the Claims

Column 6
Line 25, Claim 7 "($CaCl_2$))" should be --($CaCl_2$)--.

Signed and Sealed this
Fourth Day of August, 2020

Andrei Iancu
*Director of the United States Patent and Trademark Office*